United States Patent
Ravi

(10) Patent No.: US 6,406,981 B1
(45) Date of Patent: Jun. 18, 2002

(54) METHOD FOR THE MANUFACTURE OF SEMICONDUCTOR DEVICES AND CIRCUITS

(75) Inventor: Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 09/607,252

(22) Filed: Jun. 30, 2000

(51) Int. Cl.[7] .............................................. H01L 21/20
(52) U.S. Cl. .......................... 438/489; 117/89; 117/90; 117/95; 117/106; 438/488
(58) Field of Search ................................ 438/489, 488

(56) References Cited

U.S. PATENT DOCUMENTS

| | | | | |
|---|---|---|---|---|
| 3,928,092 A | * | 12/1975 | Ballamy et al. | 148/175 |
| 4,283,837 A | * | 8/1981 | Slob | 29/578 |
| 5,853,478 A | * | 12/1998 | Yonehara et al. | 117/89 |
| 5,885,884 A | * | 3/1999 | Jan et al. | 438/482 |
| 5,910,019 A | * | 6/1999 | Watanabe et al. | 438/488 |
| 6,032,611 A | * | 3/2000 | Asakawa et al. | 118/723 |

* cited by examiner

Primary Examiner—John F. Niebling
Assistant Examiner—Olivia T Luk
(74) Attorney, Agent, or Firm—Blakely, Sokoloff, Taylor & Zafman LLP

(57) ABSTRACT

A method of coupling a single crystal semiconductor layer on a surface of a substrate comprising a polycrystalline semiconductor material such that the single crystal layer and the polycrystalline material are in direct contact.

15 Claims, 2 Drawing Sheets

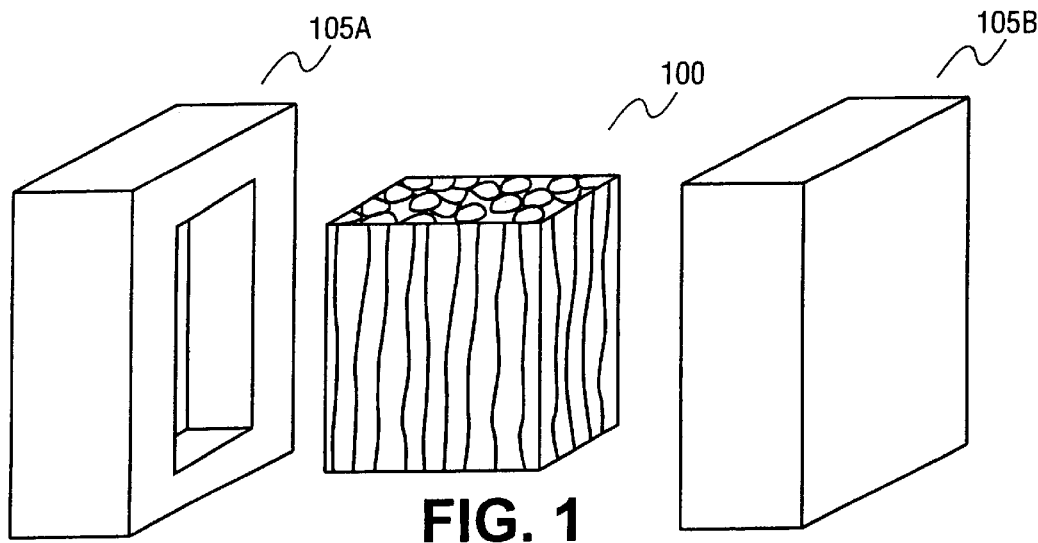
FIG. 1
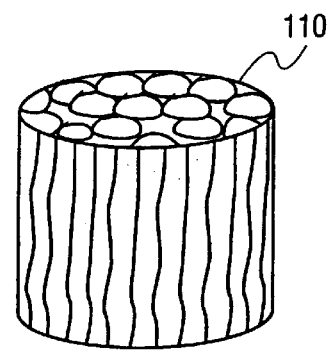
FIG. 2
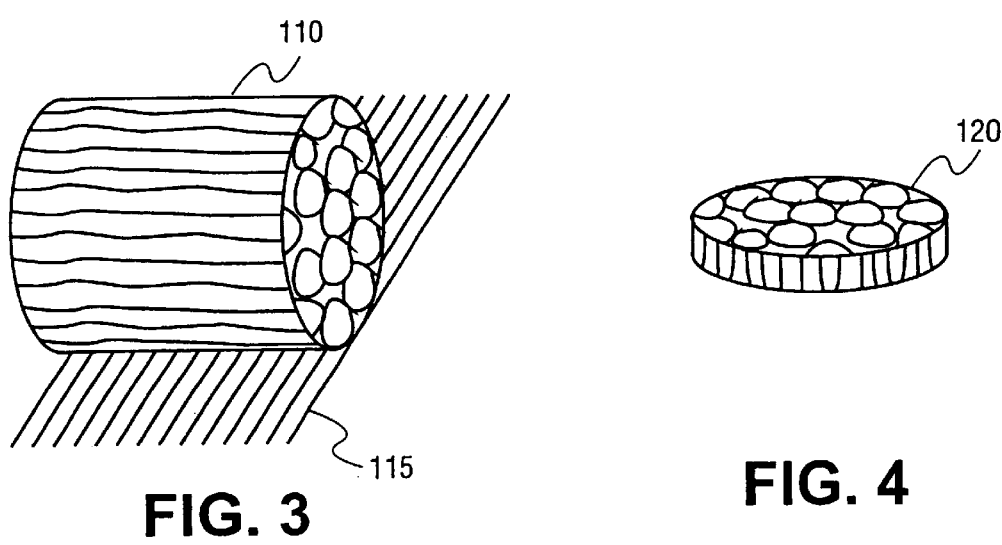
FIG. 3   FIG. 4

METHOD FOR THE MANUFACTURE OF SEMICONDUCTOR DEVICES AND CIRCUITS

BACKGROUND OF THE INVENTION

1. Field of the Invention

The invention generally relates to semiconductor-based products and more particularly the fabrication and design of integrated circuit structures.

2. Background of the Invention

A typical integrated circuit consists of a substrate on which devices are formed in or on the substrate. Such devices include, for example, transistors and capacitors that may be interconnected with one another and/or communicate with an external source.

One common approach to making an integrated circuit is to fabricate the circuit as part of a wafer, such as a semiconductor wafer, on which multiple integrated circuits are formed simultaneously. Fabricating the circuits at the wafer level allows similar circuits to be formed at one time which tends to make the fabrication process more efficient. Once formed, the wafer is singulated into the individual dies or chips.

One current method for manufacturing silicon semiconductor wafers involves the growth of cylindrical ingots of silicon utilizing the Czochralski (Cz) process of crystal growth. In this approach, a single crystal seed is dipped into a crucible containing molten silicon and slowly withdrawn as the crystal diameter is increased to produce a cylindrical ingot. The ingot is then sliced into wafers using, for example, a multi-wire saw. A wafer sliced from the ingot may serve as a substrate for integrated circuit device fabrication.

A current trend in the integrated circuit fabrication industry is to utilize larger diameter wafers. The wafer size has increased in the past years from approximately 125 mm (five inches) to approximately 200 mm (eight inches) and is pushing to diameters greater than 200 mm (e.g., 300 mm (12 inches)). As wafer diameters become larger, the crystal growth rate (or pull rate) in producing ingots of semiconductor material by the Cz method tends to slow down. Thus, productivity is reduced. For example, the typical growth or pull rate of 200 mm ingots is about 2 mm per minute whereas 300 mm ingots growth or pull rate is reduced to about 0.8 mm per minute. As wafer diameter is pushed beyond 300 mm, the productivity according to this method is likely to decrease further.

In addition to reduced productivity, increasing wafer (ingot) diameter tends to increase the size, complexity and capital cost of crystal growth machines. For example, for 300 mm crystal growth according to the Cz method, a magnetic field must be imposed on a silicon melt in the crucible to minimize convection currents. With larger melt volumes, melt convection currents increase which can lead to enhanced crucible corrosion with the potential for causing the crystal to dislocate.

In addition to the above concerns with increasing wafer (ingot) diameter size, other factors to be considered in ingot formation include the cost of consumables, such as crucibles and graphite heating elements which tend to increase as crystal diameter is increased. In addition, increasing the growth diameter lead to heavier crystals that are more difficult to handle during growth. Finally, increasing growth diameters will tend to increase crucible corrosion that can lead to structure loss due to, for example, silica particles floating from the crucible volume to the melt-solid interface.

What is needed is a method and structure whereby the desire for large wafer diameter structures can be achieved without the corresponding problems associated with such increase by traditional crystal growth methods.

BRIEF DESCRIPTION OF THE DRAWINGS

The features, aspects, and advantages of the invention will become more thoroughly apparent from the following detailed description, appended claims, and accompanying drawings in which:

FIG. 1 shows a schematic top perspective view of a polycrystalline silicon cast ingot cast from a mold in accordance with an embodiment of the invention.

FIG. 2 shows a schematic top perspective view of a cylindrical polycrystalline silicon ingot extracted from the cast ingot shown in FIG. 1.

FIG. 3 shows a top perspective view of the cylindrical polycrystalline ingot of FIG. 2 subjected to a multi-wire saw in accordance with an embodiment of the invention.

FIG. 4 shows a top perspective view of a polycrystalline wafer separated from the ingot of FIG. 2.

DETAILED DESCRIPTION OF THE INVENTION

Figure 5:
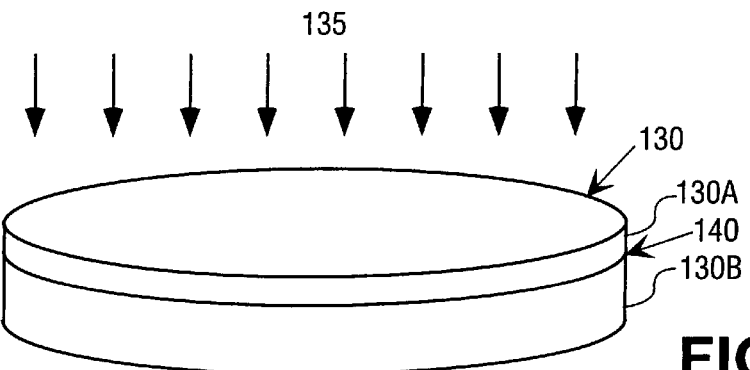
FIG. 5 shows a schematic top perspective of a single crystal silicon wafer with an agent being introduced in the wafer to create a shear point in the wafer in accordance with an embodiment of the invention.

A method and an apparatus is disclosed. According to one aspect, the method comprises coupling a single crystal semiconductor layer on a surface of the substrate comprising a polycrystalline semiconductor material such that the single crystal layer and the polycrystalline material are in direct contact (e.g., bonded to each other). According to this method, a high quality semiconductor wafer of both single crystal semiconductor material and polycrystalline semiconductor material may be realized for integrated circuit device manufacture. Thus, in one aspect, a composite wafer of single crystal semiconductor material and polycrystalline semiconductor material may replace existing monolithic crystalline wafers, epitaxial silicon wafers or silicon on insulator (SOI) structures as a durable integrated circuit device substrate. The composite wafer also is not limited by traditional crystal growth processes so inefficiencies related to increased wafer size are not realized.

An apparatus is also disclosed comprising a circuit substrate including a junction of a single crystal semiconductor layer and a polycrystalline semiconductor material and a plurality of circuit devices formed in the substrate. The apparatus may be formed, in one embodiment, as an integrated circuit in the context of forming a multitude of circuits on a composite wafer to be singulated into chips or dies once the circuits are formed. In this manner, according to the invention, a composite wafer of single crystal semiconductor material and polycrystalline semiconductor material may be manufactured having diameters of 200 mm, 300 mm, or greater.

In one embodiment of the invention, the polycrystalline material acts as a primary substrate for wafer fabrication. In one example, a polycrystalline material is cast in a mold for a large size cast. From the cast, 200 mm, 300 mm, or greater cylindrical ingots are drilled and the ingots are used to form the primary substrate of the composite wafer. Since the cast mold primarily determines the diameter of the wafer, the increased wafer diameter size from, for example, 200 mm to 300 mm, or greater may be produced without relying upon the development of new ingot casting tools. The focus of this discussion is forming composite wafers of diameters of 200 mm, 300 mm, or greater, in keeping with the current trends in the industry. It is to be appreciated that, where desired, smaller diameter wafers may also be formed according to the methods described herein.

FIG. 1 illustrates a schematic, top-perspective view of a polycrystalline semiconductor material cast ingot according to one embodiment of the invention. The polycrystalline semiconductor material is, for example, polycrystalline silicon. In one example, the cast ingot is fabricated through the use of a mold (illustrated schematically as mold halves 105A and 105B) in which silicon material is deposited and polycrystalline material is formed. One example involves melting pieces of semiconductor grade silicon in a mold made of graphite or quartz, and solidifying the molten silicon. Once the polycrystalline silicon material is formed, it is removed from the mold revealing polycrystalline silicon cast ingot 100.

As described above, polycrystalline silicon cast ingot 100 is formed in a mold. Accordingly, polycrystalline semiconductor material 100 does not rely on traditional methods of wafer fabrication such as ingot pulling machines (e.g., associated with the Czochralski method). Thus, the complexity and capital expenditure associated with typical crystal growth machines are not experienced. Instead, the dimensions of the mold determines the size of cast ingot 100. A typical polycrystalline semiconductor material growth process may generally proceed independent of the size of the mold. Thus, concerns over, in one example, wafer diameter are not realized. Accordingly, cast ingots on the order of about 700 mm by 700 mm or greater, logically much greater, may be achieved.

FIG. 2 shows a schematic top perspective view of an ingot of polycrystalline semiconductor material from cast ingot 100. In the example where cast ingot 100 is polycrystalline silicon material, ingot 110 is fabricated by drilling/coring through cast ingot 100 to form the predominantly cylindrical ingot 110. In one embodiment, ingot 110 of polycrystalline silicon material has a substantially cylindrical diameter on the order of 200 mm, 300 mm, or greater. It is appreciated that the diameter of ingot 110 may be of any diameter, limited, in one sense, by the diameter of cast ingot 100. It is also appreciated that ingot 110 may have a shape other than cylindrical depending, in part, on the drilling/coring operation.

Referring to FIG. 3, following formation, ingot 110 is sliced into individual primary wafers using conventional multi-wire saw 115 as known in the semiconductor industry.

FIG. 4 shows a schematic top-perspective view of primary wafer 120 sliced from ingot 110. Primary wafer 120 of polycrystalline semiconductor material is used as part of a composite substrate (e.g., composite wafer for integrated circuit fabrication). Primary wafer 120, in one example, has a thickness of approximately 700–900 microns ($\mu$m) according to current technology.

Ignoring primary wafer 120 for the moment, FIG. 5 shows single crystal semiconductor secondary wafer 130. In one embodiment, single crystal semiconductor secondary wafer 130 is a single crystal silicon material formed according to known techniques. In this example, secondary wafer 130 has a diameter similar to the diameter of primary wafer 120. One way to form secondary wafer 130 is through conventional single crystal ingot pulling techniques (e.g., Cz method), wafering, and polishing as known in the art.

FIG. 5 also shows secondary wafer 130 exposed to an agent to transform the characteristics of a portion of secondary wafer 130. In one embodiment, agent 135 is introduced into secondary wafer 130 to stress a portion of secondary wafer 130. In the example of single crystal silicon, a suitable agent to stress a portion of secondary wafer 130 includes hydrogen gas. In one embodiment, hydrogen gas introduced by ion implantation into the wafer will travel approximately 2 microns ($\mu$m) into the surface of secondary wafer 130, distressing a point 2 $\mu$m into the secondary wafer. The material above and below stress point 140 (represented in FIG. 5 as 130A and 130B) will be generally uneffected by the introduction of agent 135 (e.g., hydrogen ions).

In one embodiment, secondary wafer 130 has a diameter similar to the diameter of primary wafer 120 and a thickness on the order of at about 500–1000 $\mu$m, in one embodiment, about 725 microns. It is to be appreciated that different thicknesses of secondary wafer 130 may be formed depending on a desire to reuse any portion of secondary wafer 130 not used in the formation of a composite wafer. The aspect of reusing a portion of secondary wafer 130 will be described in the forthcoming discussion.

Figure 6:
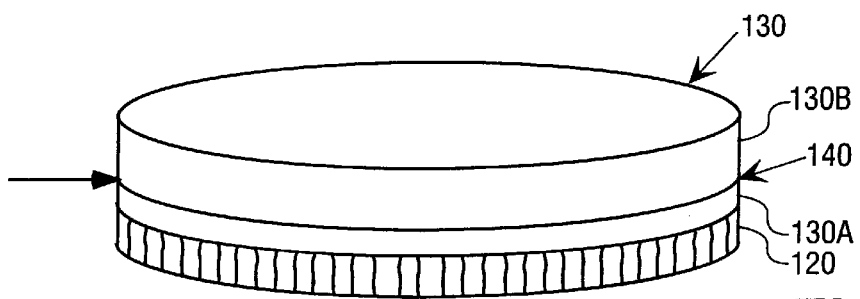
FIG. 6 shows a schematic top perspective view of the combined polysilicon wafer of FIG. 4 combined with the single crystal silicon wafer of FIG. 5 in accordance with an embodiment of the invention.

Returning to primary wafer 120 illustrated in FIG. 4, FIG. 6 shows secondary wafer 130 bonded to primary wafer 120. In one example, the bond of secondary wafer 130 to primary wafer 120 is a diffusion bond. Where each of the semiconductor material is silicon, a diffusion bond may be created between the crystalline material by placing the materials together in the presence of heat, such as a temperature on the order of 400–1000° C. for five to twenty minutes. Under such condition, silicon diffuses between the primary and secondary wafers and primary wafer 120 and secondary wafer 130 are fused together.

The prior art generally taught that an insulative material such as silicon dioxide or silicon nitride had to be placed between a single crystalline material and an adjoining substrate which is also single crystal. Such intervening layer was introduced to inhibit the propagation of undesired species into the single crystalline material.

In one embodiment, the invention contemplates the direct contact between single crystalline silicon and polycrystalline silicon. In one example, such contact is achieved through thermal bonding or diffusion. To enable bonding of the two entities, the invention contemplates that the top surface of primary wafer 120 and, possibly, the bottom surface of the secondary wafer 130 are planarized in such a way that exposed grain boundaries at the surface are inhibited. In the case of silicon semiconductor material as primary wafer 130, primary wafer 130 may be planarized using a chemical or chemical-mechanical polish. In one embodiment, a suitable polish includes a chemical-mechanical polish such as a mixture of potassium hydroxide (KOH) with a silica slurry. A further approach is to use a mechanically-rich polishing process rather than a chemically-rich polishing process. Another approach is a combination of chemical (in an acid (e.g. HF, $HNO_3$) or alkali (e.g., KOH) mixture) etching rough polishing, and fine polishing using conventional chemical-mechanical polishing processes used in conventional silicon wafer fabrication.

FIG. 6 shows that secondary wafer 130 is bonded to primary wafer 120 adjacent portion 130A of secondary wafer 130. In other words, distressing agent 135 is introduced into a surface including portion 130A to distress a portion of secondary wafer 130 having a depth of 2 μm into the surface of secondary wafer 130. The stress point 140 separates portions 130A and 130B.

In another embodiment, an insulative material such as an oxide (e.g., $SiO_2$) may be interposed between primary wafer 120 and secondary wafer portion 130A. One way this is achieved is by the deposition or growth of the dielectric material on the surface of secondary wafer portion 130A that is bonded to primary wafer 120. In this manner, a SOI substrate may be fabricated. Alternatively, the dielectric (e.g., oxide) may be introduced on primary wafer 120 prior to bonding.

Figure 7:
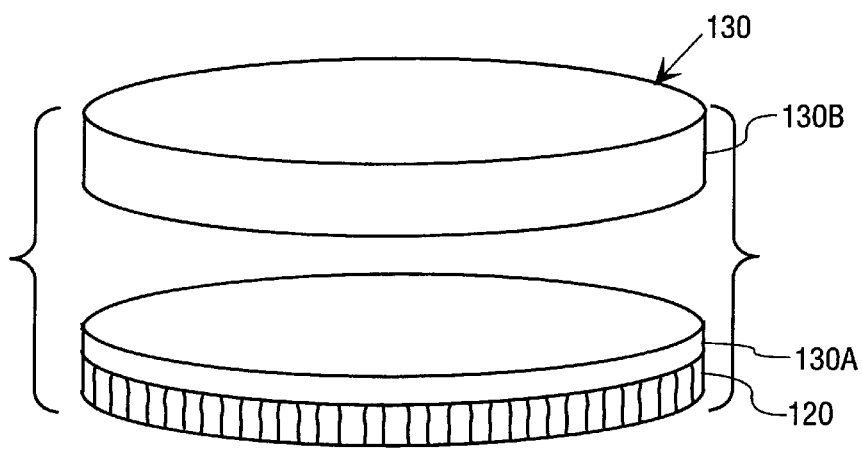
FIG. 7 shows the structure of FIG. 6 after shearing the single crystal silicon wafer at a shear point in accordance with an embodiment of the invention.

FIG. 7 shows the structure of FIG. 6 after separating portion 130B of secondary wafer 130 from the composite structure at stress point 140. The separation is achieved by applying stress at stress point 140, such as through thermal cleaving or shocking. After the removal of portion 130B, the composite wafer comprises primary wafer 120 of polycrystalline material and a secondary wafer of portion 130A of single crystalline semiconductor material, for example, about 2 μm single crystal silicon. Remainder portion 130B of secondary wafer 130 may be reused with other primary wafers to form additional composite structures by repeating the distressing and bonding operations described above.

Figure 8:
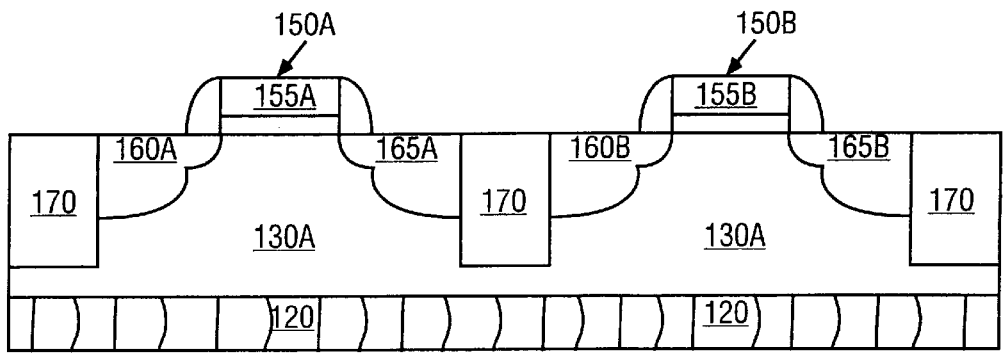
FIG. 8 shows a cross-sectional side view of a portion of a semiconductor substrate of polysilicon and single crystal silicon, with transistor devices formed in and on the substrate in accordance with an embodiment of the invention.

The composite wafer illustrated in FIG. 7 may be used, in one aspect, as a substrate for integrated circuit processing, such as the formation of chips or dies according to known integrated circuit formation. As an example, FIG. 8 shows a cross-sectional side view of a portion of a composite substrate having devices formed in or on the substrate. FIG. 8 shows adjacent transistors 150A and 150B separated by shallow trench isolation 170. Transistor 150A includes gate electrode 155A and junction regions 160A and 165A. In this example, junction regions 160A and 165A are formed in single crystalline portion 130A of the composite wafer. Similarly, transistor 150B includes transistor gate electrode 155B and junction regions 160B and 165B are formed in single crystalline portion 130A of the composite wafer.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
   coupling a single crystal semiconductor layer on a surface of a substrate, the surface comprising a polycrystalline semiconductor material such that the single crystal layer and the polycrystalline material are in direct contact.

2. The method of claim 1, wherein coupling comprises bonding the single crystal layer to the polycrystalline material.

3. The method of claim 2, wherein prior to bonding, further comprising introducing an agent into the single crystal layer that distresses a portion of the single crystal layer at a depth from a surface of the single crystal layer, and subsequent to bonding, dividing the single crystal layer at the distressed portion.

4. The method of claim 3, wherein the agent comprises hydrogen ions.

5. The method of claim 1, prior to coupling, further comprising:
   minimizing the exposed grain boundaries on the surface of the substrate to which the single crystal layer is to be coupled.

6. The method of claim 5, wherein minimizing the exposed grain boundaries comprises polishing the surface of the substrate.

7. A method comprising:
   coupling a single crystal semiconductor layer to a polycrystalline semiconductor substrate to form a circuit substrate such that single crystal material of the single crystal layer is in contact with polycrystalline material of the polycrystalline substrate at a junction; and
   forming circuit devices in the circuit substrate.

8. The method of claim 7, wherein coupling comprises bonding the single crystal layer to the polycrystalline material.

9. The method of claim 8, wherein prior to bonding, further comprising introducing an agent into the single crystal layer that distresses a portion of the single crystal layer at a depth from a surface of the single crystal layer, and subsequent to bonding, dividing the single crystal layer at the distressed portion.

10. The method of claim 9, wherein the agent comprises hydrogen ions.

11. The method of claim 7, prior to coupling, further comprising:
    minimizing the exposed grain boundaries on the surface of the substrate to which the single crystal layer is to be coupled.

12. The method of claim 11, wherein minimizing the exposed grain boundaries comprises polishing the surface of the substrate.

13. A method comprising:
    forming a structure composite by coupling a single crystal semiconductor structure to a surface of a substrate comprising a polycrystalline semiconductor material.

14. The method of claim 13, further comprising interdisposing a dielectric material between the single crystal layer and the surface of the substrate.

15. The method of claim 13, wherein forming the structure composite comprises one of bonding or diffusing the single crystal semiconductor structure to the substrate.

* * * * *